(12) United States Patent
Russell et al.

(10) Patent No.: US 7,903,483 B2
(45) Date of Patent: Mar. 8, 2011

(54) INTEGRATED CIRCUIT HAVING MEMORY WITH CONFIGURABLE READ/WRITE OPERATIONS AND METHOD THEREFOR

(75) Inventors: Andrew C. Russell, Austin, TX (US); Shayan Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 71 days.

(21) Appl. No.: 12/275,622

(22) Filed: Nov. 21, 2008

(65) Prior Publication Data

US 2010/0128541 A1 May 27, 2010

(51) Int. Cl.
*G11C 29/00* (2006.01)
(52) U.S. Cl. ............... 365/200; 365/226; 365/189.02
(58) Field of Classification Search ............. 365/200, 365/226, 189.02
See application file for complete search history.

(56) References Cited

U.S. PATENT DOCUMENTS

| | | | |
|---|---|---|---|
| 5,298,816 A | 3/1994 | Kaplinsky | |
| 6,791,864 B2 | 9/2004 | Houston | |
| 7,079,426 B2 | 7/2006 | Zhang et al. | |
| 7,085,175 B2 | 8/2006 | Remington et al. | |
| 7,292,495 B1 | 11/2007 | Kenkare et al. | |
| 7,443,374 B2 * | 10/2008 | Hudson | 345/98 |
| 7,502,275 B2 | 3/2009 | Nii et al. | |
| 2006/0186935 A1 | 8/2006 | Hwang et al. | |
| 2006/0262628 A1 | 11/2006 | Nii et al. | |
| 2008/0158939 A1 * | 7/2008 | Chen et al. | 365/154 |

OTHER PUBLICATIONS

Non-Published U.S. Appl. No. 11/847,424 filed with the US Patent Office on Aug. 30, 2007, first named inventor Matthew S. Berens.
Notice of Allowance dated Sep. 9, 2010 in U.S. Appl. No. 12/388,911.

* cited by examiner

*Primary Examiner* — Huan Hoang
(74) *Attorney, Agent, or Firm* — Daniel D. Hill

(57) ABSTRACT

An integrated circuit having a memory and a method for operating the memory are provided. The method for operating the memory comprises: accessing a first portion of the memory, the first portion having a first access margin; detecting an error in the first portion of the memory; changing the first access margin to a second access margin, the second access margin being different than the first access margin; determining that the error is corrected with the first portion having the second access margin; and storing an access assist bit in a first storage element, the access assist bit corresponding to the first portion, wherein the assist bit, when set, indicates that subsequent accesses to the first portion are accomplished at the second access margin.

20 Claims, 6 Drawing Sheets

INTEGRATED CIRCUIT HAVING MEMORY WITH CONFIGURABLE READ/WRITE OPERATIONS AND METHOD THEREFOR

BACKGROUND

1. Field

This disclosure relates generally to integrated circuits, and more specifically, to an integrated circuit having a memory with configurable read/write operations and method therefor.

2. Related Art

One of the most common ways to reduce power consumption in integrated circuits is to lower the power supply voltage. However, lowering power supply voltage can cause increased failures and unreliable operation in some circuits. For example, reducing the power supply voltage to a memory array can reduce read margins and cause the memory array to be more susceptible to soft errors and process variations. The problem is made worse as transistor sizes are decreased. On the other hand, the lower power supply voltage to the memory array can improve write margins. Therefore, in some implementations, the power supply voltage to the memory array is boosted during read operations and decreased during write operations. However, increasing and decreasing the array voltage as a way to improve read and write margins may cause increased power consumption.

Therefore, what is needed is a circuit and method for solving the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
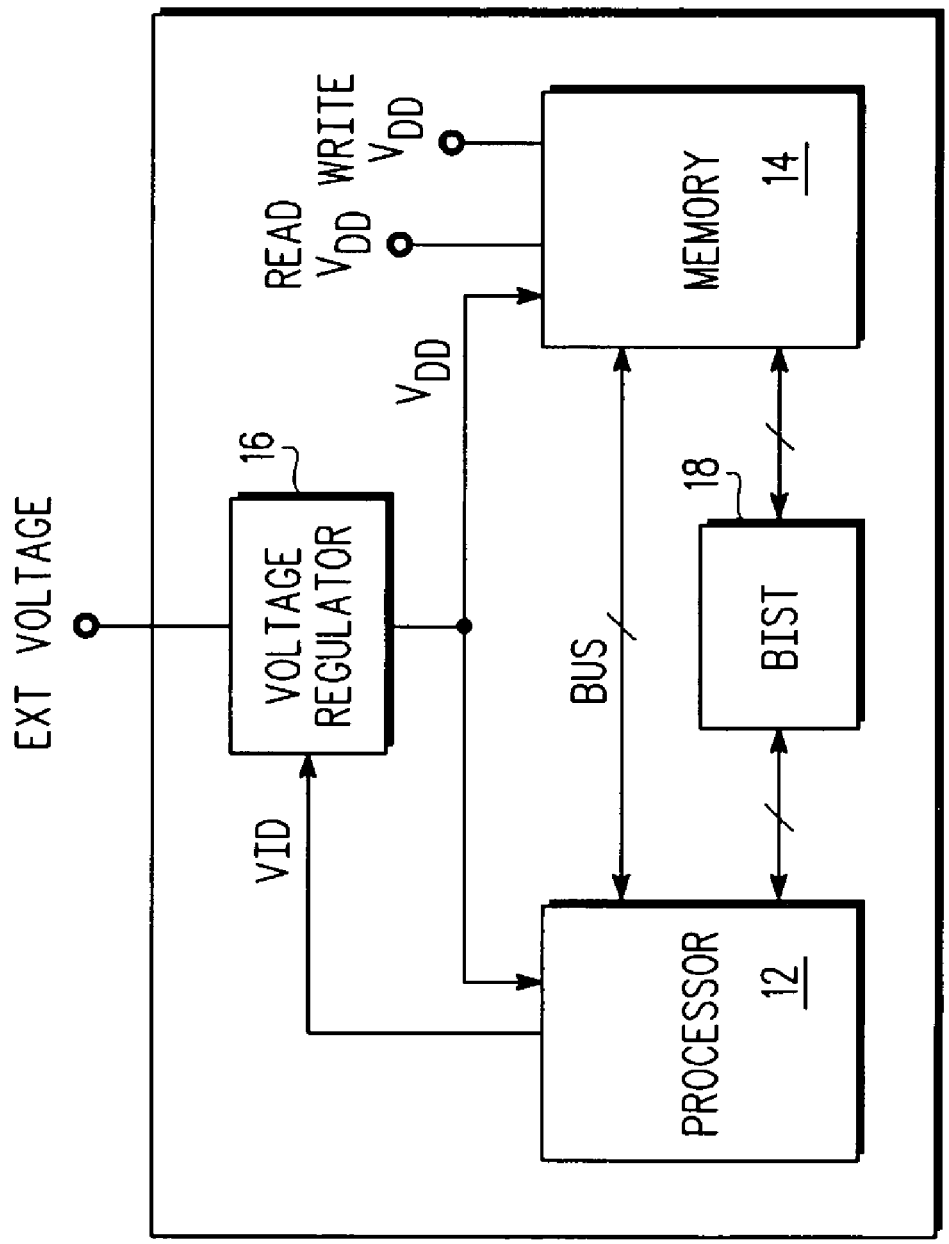
FIG. 1 illustrates, in block diagram form, an integrated circuit in accordance with an embodiment.

Generally, there is provided, a method for operating a memory, and a memory that includes read assist bits and write assist bits. The locations of memory cells having inadequate read margins and/or write margins for reliable access operations are stored in a separate memory. In the case of a cell with an inadequate read margin, a read assist bit is set to provide an increased power supply voltage to improve the read margin of the unreliable cell during a read operation. In the case of a cell with an inadequate write margin, a write assist bit is set to provide a decreased power supply voltage to improve the write margin of the unreliable cell during a write operation. The read and write assist bits correspond to a portion of the memory, for example, a cache line. In another embodiment, the read and write assist bits may correspond to a different sized portion of the memory, for example, a size less than a size of a cache line. The correlated failure voltage values are stored in registers and used as threshold voltages. This is particularly useful in a cache where there are only a few entries, or portions, that contain voltage sensitive weak bits. This minimizes excess power consumption and speed latency caused by switching power supply voltages. Thus, for example, a cache with two entries in one way out of all entries in an eight way set associative cache memory will need a power supply voltage manipulation only when one of the two entries accessed.

In one aspect, there is provided, a method for operating a memory, comprising: accessing a first portion of the memory, the first portion having a first access margin; detecting an error in the first portion of the memory; changing the first access margin to a second access margin, the second access margin being different than the first access margin; determining that the error is corrected with the first portion having the second access margin; and storing an access assist bit in a first storage element, the access assist bit corresponding to the first portion, wherein the assist bit, when set, indicates that subsequent accesses to the first portion are accomplished at the second access margin. Accessing the first portion of the memory may further comprise accessing the first portion of the memory for a read operation, and wherein the first and second access margins are first and second read margins. Accessing the first portion of the memory may further comprise accessing the first portion of the memory for a write operation, and wherein the first and second access margins are first and second write margins. Changing the first access margin to the second access margin may further comprise changing a magnitude of a power supply voltage provided to the first portion. In another embodiment, changing the first access margin to the second access margin may further comprise changing an internal voltage level of the memory when the first portion is accessed. The method may further comprise comparing the magnitude of the power supply voltage provided to the first portion to a first predetermined threshold, and in response to the magnitude having a predetermined relationship to the first predetermined threshold, changing the first predetermined threshold to a second predetermined threshold. The first portion of the memory may comprise a first row of memory cells, and wherein the first row of memory cells is provided with a first power supply voltage during the step of accessing, the first power supply voltage being different than a second power supply voltage provided to a second row of memory cells during the step of accessing. Storing the access assist bit in a first storage element may further comprise storing the access assist bit in a location of a status array associated with the memory. Detecting the error in the first portion may further comprise detecting the error using a built-in self-test (BIST) circuit or error correction code (ECC). The memory may be a cache, where the cache comprises a plurality of static random access memory (SRAM) cells.

In another aspect, there is provided, a method for accessing a memory comprising: receiving an access request to a first portion of the memory with a power supply voltage applied to the first portion of the memory at a first value; detecting an error in the first portion of the memory; changing the power supply voltage to a second value; determining that the error is corrected when the power supply voltage is at the second value; and storing an assist bit in a first storage element, the assist bit corresponding to the first portion, wherein the assist bit, when set, indicates that subsequent accesses to the first portion are accomplished with the power supply voltage at the second value. The memory access request may be a read request, and wherein changing the power supply voltage to the second value further comprises increasing the power supply voltage to the second value in response to reading the assist bit. The memory access request may be a write request, and wherein changing the power supply voltage to the second value further comprises decreasing the power supply voltage to the second value in response to reading the assist bit. The memory may be a cache memory, where the first portion comprises a cache line. Storing the assist bit in the first storage element may further comprise: storing a write assist bit for setting the power supply voltage provided to the first portion to a third value during a write operation of the first portion; and storing a read assist bit for setting the power supply voltage provided to the first portion to a fourth value during a read operation of the first portion. Storing the write assist bit may further comprise storing the write assist bit in a first location of a status array associated with the first portion and storing the read assist bit and may further comprise storing the read assist bit in a second location of the status array associated with the first portion.

In yet another aspect, there is provided, an integrated circuit, comprising: a processor; a first memory coupled to the processor, the first memory having an array comprising a plurality of portions of memory cells, each memory cell of the plurality of portions of memory cells having a power supply voltage terminal; a voltage regulator coupled to the processor and to the memory, the voltage regulator for providing a first power supply voltage to both the processor and to the memory; an array power supply voltage multiplexer having a first input for receiving the first power supply voltage, a second input for receiving a second power supply voltage, and an output coupled to the power supply voltage terminals of a first portion of the plurality of portions of memory cells; and a second memory coupled to the array power supply voltage multiplexer, the second memory for storing an access assist bit, the access assist bit associated with the first portion of the plurality of portions of memory cells, the access assist bit for determining which one of the first and second power supply voltages is coupled to the power supply voltage terminals of the first portion of the plurality of memory cells during an access of the first portion. The first portion may be characterized as being a cache line of memory cells. The array power supply voltage multiplexer may further comprise a third input for receiving a third power supply voltage, wherein the second memory is for storing a second access assist bit, the second access assist bit is associated with the first portion, the access assist bit and the second access assist bit for determining which one of the first, second, and third power supply voltages is coupled to the power supply voltage terminals of the first portion during an access of the first portion. The integrated circuit may further comprise: a threshold voltage register for storing a first plurality of bits corresponding to an access threshold voltage; and a comparator having a first input coupled to receive the first plurality of bits, and a second input coupled to receive a second plurality of bits corresponding to the first power supply voltage, and an output coupled to the array power supply voltage multiplexer, wherein one of the first power supply voltage and the second power supply is provided to the first portion in response to a predetermined comparison result. The second memory may be characterized as being a status array having a plurality of entries, each of the plurality of entries corresponding to a portion of the plurality of portions of the first memory. Also, the second memory may be accessed prior to the first memory. The access assist bits stored in the second memory may have a feature size that is larger than a feature size of the bit cell of the first memory.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

FIG. 1 illustrates, in block diagram form, an integrated circuit 10 in accordance with an embodiment. Integrated circuit 10 includes a processor 12, memory 14, voltage regulator 16, and built-in self-test block 18. Processor 12 and memory 14 are bi-directionally coupled together using a bus labeled "BUS". Voltage regulator 16 has a power supply terminal for receiving an externally generated power supply voltage labeled "EXT VOLTAGE". Both processor 12 and memory 14 include a first power supply voltage terminal for receiving a power supply voltage from voltage regulator 16 labeled "VDD". Also, memory 14 includes a second power supply voltage terminal for receiving a read assist power supply voltage labeled "READ VDD" and a third power supply voltage terminal for receiving a write assist power supply voltage labeled "WRITE VDD". In one embodiment, memory 14 is a cache memory coupled to provide or receive instructions, addresses, or data in response to access requests from processor 12. In one embodiment, memory 14 may be a level 2 (L2) cache consisting of data, tag, and status memory blocks as well as control logic. A magnitude of power supply voltage VDD is determined by processor 12. Processor 12 provides a digital voltage identifier labeled "VID" to an input of voltage regulator 16. In response to the voltage identifier VID, voltage regulator 16 provides power supply voltage VDD with a predetermined magnitude. Thus, processor 12 can change the power supply voltage to circuit blocks of integrated circuit 10 depending on, for example, the operating mode of processor 12. For example, during a low power operating mode, processor 12 can assert an appropriate voltage identifier VID to lower power supply voltage VDD to reduce power consumption of integrated circuit 10. In addition, during a self-test mode, BIST 18 can change voltage identifier VID to provide the ability to test memory 14 at various power supply voltages. The assist voltages READ VDD and WRITE VDD may be fixed or variable depending on the embodiment. The operation of memory 14 will be discussed below in more detail.

Figure 2:
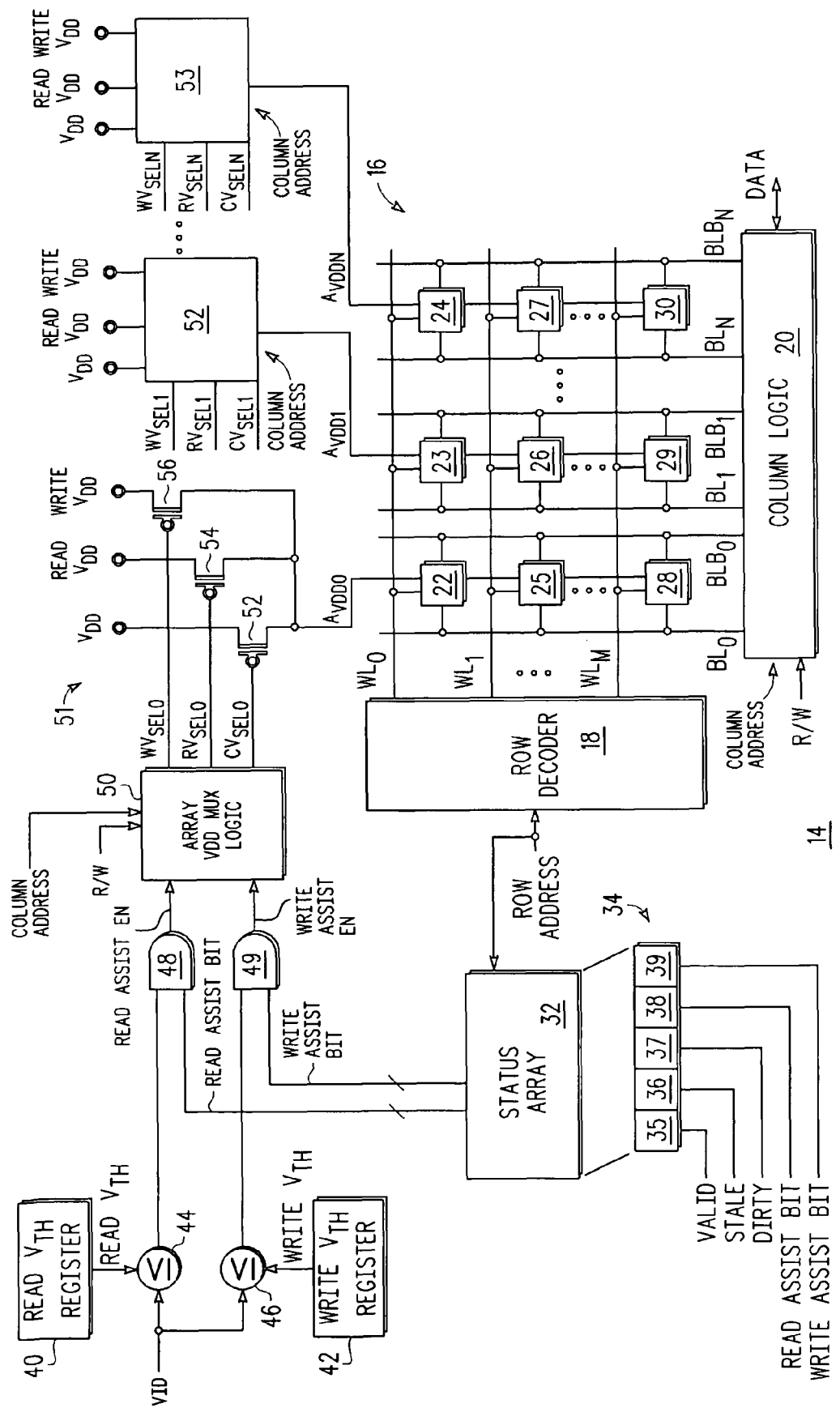
FIG. 2 illustrates, in partial block diagram form and partial logic diagram form, the memory of the integrated circuit of FIG. 1 in more detail.

FIG. 2 illustrates, in partial block diagram form and partial logic diagram form, a memory 14 of FIG. 1 in more detail. Memory 14 includes memory array 16, row decoder 18, column logic 20, status array 32, read assist threshold voltage (VTH) register 40, write assist VTH register 42, comparators 44 and 46, AND logic gates 48 and 49, and array power supply voltage multiplexers 51, 52, and 53.

Memory array 16 includes a plurality of memory cells, such as for example, memory cells 22-30, organized in rows and columns. A row includes a word line and all of the memory cells coupled to the word line. For example, one row includes word line WL0 and memory cells 22, 23, and 24. Another row includes word line WL1 and memory cells 25, 26, and 27. Another row includes word line WLM and memory cells 28, 29, and 30. A column includes a bit line, or bit line pair, and all of the memory cells coupled to the bit line, or bit line pair. For example, one column includes bit line pair BL0/BLB0 and memory cells 22, 25, and 28. Another column includes bit line pair BL1/BLB1 and memory cells 23, 26, and 29. Another column includes bit line pair BLN/BLBN and memory cells 24, 27, and 30. In one embodiment, memory cells 22-30 may be static random access memory (SRAM) cells. In another embodiment, memory cells 22-30 may be another type of volatile or non-volatile memory.

Row decoder 18 includes an input for receiving a multi-bit row address labeled "ROW ADDRESS", and an output coupled to each of the word lines. Row decoder 18 selects one of the word lines WL0-WLM in response to receiving a row address. Note that in the illustrated embodiment, a row stores multiple cache lines or portions of different cache lines for processor 12. In another embodiment, a row may store a single cache line or a portion of a single cache line in which case a column address and column multiplexers would not be used. Column logic 20 includes column multiplexers, sense amplifiers, bit line loads, write drivers, precharge and equalization circuits, and the like. Column logic 20 is coupled to each of the bit line pairs. During a read operation of memory 14, a control signal labeled "R/W" is asserted at a predetermined logic state, for example, a logic high, and a row address selects one of the word lines causing a stored logic state of each of the memory cells to be provided to a corresponding bit line pair in the form of a differential voltage. The column multiplexers of column logic 20 select one group of a plurality of column groups to couple to the sense amplifiers based on the column address. For example, in one embodiment, a 4-to-1 column multiplexer may be implemented where one in four columns is selected by the column multiplexers for coupling to the sense amplifiers or write drivers. The sense amplifiers of column logic 20 sense and amplify the differential voltages and corresponding signals are output from column logic 20 as data signals labeled "DATA". A write operation is essentially the opposite of a read operation. That is, control signal R/W is negated as, for example, a logic low, and data signals DATA are provided via write drivers to memory cells coupled to a word line selected by the row address.

In the illustrated embodiment, each column of memory array 16 is coupled to its own power supply voltage multiplexer and each power supply voltage multiplexer is coupled to its own array VDD multiplexer control logic block. Each array VDD multiplexer control logic block receives a column address, a read assist enable, a write assist enable and read/write signal to allow controlling the voltage of each column independently. For example, if a correctable error that affects a cell during a write is discovered in the column comprising cells 23, 26, and 29, the voltage AVDD1 is coupled to the write VDD supply voltage WRITE VDD during a write operation to the column comprising cells 23, 26, and 29. Independent column voltage control is required when multiple cache lines are stored interleaved on the same row. For example, during a write operation where four cache lines are stored on a row, one of the cache lines will be written and the other three will undergo a dummy read. The write assist bit for the cache line being written will be used to determine if write assist needs to be enabled. For the three cache lines being dummy read, the read assist bits for each of the three cache lines will be examined to determine if any of the three cache lines require read assist to ensure that the bitcells remain stable during the dummy read. During a read operation, where four cache lines are stored on a row, the read assist bit for the cache line being read will be examined to determine if read assist needs to be enabled. For the other three cache lines being dummy read, the read assist bits for each of the three cache lines will be examined to determine if any of the three cache lines require read assist to ensure that the bitcells remain stable during the dummy read. All the bits of a cache line on a row would share the same read assist enable and write assist enable signals. In one embodiment where there are four cache lines each being from a different way stored on the same row, there would be one read assist enable and one write assist enable for each of the four ways. Consequently, there would be four AND gates similar to AND gate 48 for generating each of the four read assist enable signals and four AND gates similar to AND gate 49 for generating each of the write assist enable signals. Each of the four read assist enable AND gates would take the output of comparator 44 as an input and each of the four write assist enable AND gates would take the output of comparator 46 as an input. In an embodiment where a row stores a single cache line or a portion of a single cache line, no column address is used and only one array power supply voltage multiplexer would be used for memory array 16.

Array power supply voltage multiplexer 51 is coupled to array VDD multiplexer logic 50 and includes P-channel transistors 52, 54, and 56. Array VDD multiplexer control logic 50 has an input for receiving the read/write signal R/W, an input coupled to an output of AND logic gate 48 labeled "READ ASSIST EN", an input coupled to an output of AND logic gate 49 labeled "WRITE ASSIST EN", an output for providing a write voltage select signal labeled "WVSEL0", an output for providing a read voltage select signal labeled "RVSEL0", and an output for providing a chip voltage select signal labeled "CVSEL0". P-channel transistor 52 has a first current electrode (source) coupled to a power supply voltage terminal for receiving power supply voltage VDD, a second current electrode (drain) coupled to provide a power supply voltage labeled "AVDD0" to a column of memory cells such as memory cells 22, 25, and 28, and a control electrode (gate) coupled to receive chip voltage select signal CVSEL0. P-channel transistor 54 has a first current electrode coupled to receive supply voltage READ VDD, a second current electrode coupled to the second current electrode of transistor 52, and a control electrode coupled to receive read voltage select signal RVSEL0. P-channel transistor 56 has a first current electrode coupled to receive power supply voltage WRITE VDD, a second current electrode coupled to the second current electrodes of transistors 52 and 54, and a control electrode coupled to receive write voltage select signal WVSEL0. AND logic gate 48 and AND logic gate 49 drive the read assist enable and write assist enable signals to as many array VDD multiplexer control logic blocks as there are cache line bits stored on the row. For example, if 32 cache line bits are store on WL0, then AND logic gate 48 would drive 32 array VDD multiplexer control logic blocks for each of the cache line bits. Array power supply voltage multiplexers 52 and 53 are similar to array power supply voltage multiplexer 51. Note that in other embodiments, multiplexers 51, 52, and 53 may be different than disclosed in FIG. 2. In another embodiment, the array VDD multiplexer control logic blocks are aggregated into a single logic block responsible for generating the signals that control all the array power supply voltage multiplexers.

Read assist VTH register 40 is for storing one or more bits that correspond to a read threshold voltage. The read assist threshold voltage is the voltage at which the first read failure occurs due to a marginal bitcell. For voltages above the read assist threshold voltage, read assist is disabled to save power since all bitcells can be reliably read. However, for memory read accesses at or below the read assist threshold voltage, the read assist bits are enabled to determine which entries require read assistance since read failures can occur if read assist is not used at or below the read assist threshold voltage. In another embodiment, the read assist bits are used without the read assist threshold voltage register, in which case the read assist bits are always enabled and potential power reduction is sacrificed for a simpler implementation of enabling read assist on a more granular level. The read assist VTH bits are provided to an input of comparator 44. Write assist VTH register 42 is for storing one or more bits that correspond to a write assist threshold voltage. The write assist threshold voltage is the voltage at which the first write failure occurs due to a marginal bitcell. For voltages above the write assist threshold voltage, write assist is disabled to save power since all bitcells can be reliably written. However, for memory write accesses at or below the write assist threshold voltage, the write assist bits are enabled to determine which entries require write assist since write failures can occur if write assist is not used at or below the write assist threshold voltage. In another embodiment, the write assist bits are used without the write assist threshold voltage register in which case the write assist bits are always enabled and potential power reduction is sacrificed for a simpler implementation of enabling write assist on a more granular level. The write assist VTH bits are provided to an input of comparator 46. An input of comparators 44 and 46 receive the voltage identifier VID from processor 12. The voltage identifier VID represents the current voltage of VDD as determined by processor 12. If VID is equal to or less than the READ ASSIST VTH, then the supply voltage of the memory cells of memory array 16 can be modified, or assisted, to improve read reliability. Likewise, if VID is equal to or less than the WRITE ASSIST VTH, then the supply voltage of the memory cells of memory array 16 can be modified to improve write reliability. The contents of registers 40 and 42 can be updated by processor 12. AND logic gate 48 has an input coupled to the output of comparator 44. AND logic gate 49 has an input coupled to the output of comparator 46.

Status array 32 includes a plurality of entries such as entry 34. An entry of the plurality of entries corresponds to a portion, or cache line, of memory array 16. Status array 32 stores the status bits for one way. In an embodiment of an 8 way set associative cache, there may be 8 status arrays, each storing the status bits for each of the 8 ways. In an embodiment where the column decode for memory 16 is by way (ie the way hit is used to select one of a group of columns for reading or writing), each of the 8 ways would have a read assist bit and write assist bit for controlling the column voltages of cache lines interleaved by way. Since the way status bits are first accessed for selecting a column of memory 16 prior to accessing memory 16, the read and write assist bits are added to the way status entries since they are way centric and also needed prior to accessing memory 16. In an embodiment where a portion of an address is used to select a column of memory 16, the read and write assist bits may be stored in a memory other than the status array. Status array 32 has an input for receiving at least a part of row address ROW ADDRESS. When a cache line is selected for a read or write operation, a corresponding entry of status array 32 is selected. In the illustrated embodiment, each entry of status array 32 includes bit fields 35-39.

Bit field 35 may include one or more bits labeled "VALID". Bit field 36 may include one or more bits labeled "STALE". Bit field 37 may include one or more bits labeled "DIRTY". Bit field 38 may include one or more bits labeled "READ ASSIST BIT". The read assist bit used to indicate that one or more bits of a cache line may fail during a read operation to that cache line and hence read assistance is needed for a successful read to occur. Bit field 38 may comprise two read assist bits where the first read assist bit indicates if read assist is needed for the first half of a cache line and the second read assist bit indicates if read assist is needed for the second half of a cache line. Bit field 39 may include one or more bits labeled "WRITE ASSIST BIT". The write assist bit used to indicate that one or more bits of a cache line may fail during a write operation to that cache line and hence write assistance is needed for a successful write to occur. In another embodiment, the read and write assist bits are combined into a single assist bit that when set will enable read assist for a read access and write assist for a write access and when not set will disable both read and write assist. The DIRTY bits, VALID bits, and STALE bits are conventional status array bits used for cache coherency and will not be discussed further. Also, in other embodiments, the entries of status array 32 may include more or fewer bit fields. In one embodiment, the bits stored in status array 32 may be characterized to have a feature size that is larger than a feature size of a bitcell of memory array 16, such that at lower power supply voltages status array 32 can operate at a substantially lower failure rate than memory array 16. In this way, status array 32 can be coupled to one power supply voltage, for example, the first power supply voltage, and will read and write reliably at lower supply voltages. In another embodiment, the read and write assist bits are stored in a memory other than a status array.

Generally, in the case where a row of memory array 16 stores a single cache line and array power supply multiplexer 51 is coupled to all of the columns of the array, the corresponding read or write assist bit field is checked to see if the selected cache line requires a power supply voltage modification while being accessed. If the corresponding read or write assist bit field indicates that modification is necessary, the read or write assist bit is provided to array VDD multiplexer logic 50 and the appropriate assist power supply voltage is provided to the cache line. More specifically, in the case of a write operation to a selected cache line (row) that includes defective cells, an asserted write assist bit (WRITE ASSIST BIT) is provided to the input of AND logic gate 49. If the output of comparator 46 indicates that VID is less than or equal to write assist voltage threshold WRITE VTH, write assist enable signal WRITE ASSIST EN is asserted, and array VDD multiplexer logic 50 causes transistor 56 to become conductive and provide power supply voltage WRITE VDD to the supply voltage terminals of the memory cells of the selected cache line, thus increasing the write margin of the selected cache line. Note that in one embodiment, WRITE VDD may be a fixed voltage of about 0.7 volts, READ VDD may be a fixed voltage of about 1 volt, and VDD may be variable between about 1 volt and 0.75 volts. During a read operation to a selected cache line that includes defective cells, an asserted read assist bit (READ ASSIST BIT) is provided to the input of AND logic gate 48. If the output of comparator 44 indicates that VID is less than or equal to READ VTH, read assistance is needed, and array VDD multiplexer logic 50 causes transistor 54 to become conductive and provide power supply voltage READ VDD to the supply voltage terminals of the memory cells of the selected cache line, thus increasing the read margin of the selected cache line. Another embodiment may only use write assist bits and a write assist threshold voltage register. The use of read assist bits does not require the use of write assist bits and vice versa. The determination of which bits of array 16 are defective because of reduced read and/or write margins will be discussed below.

Figure 3:
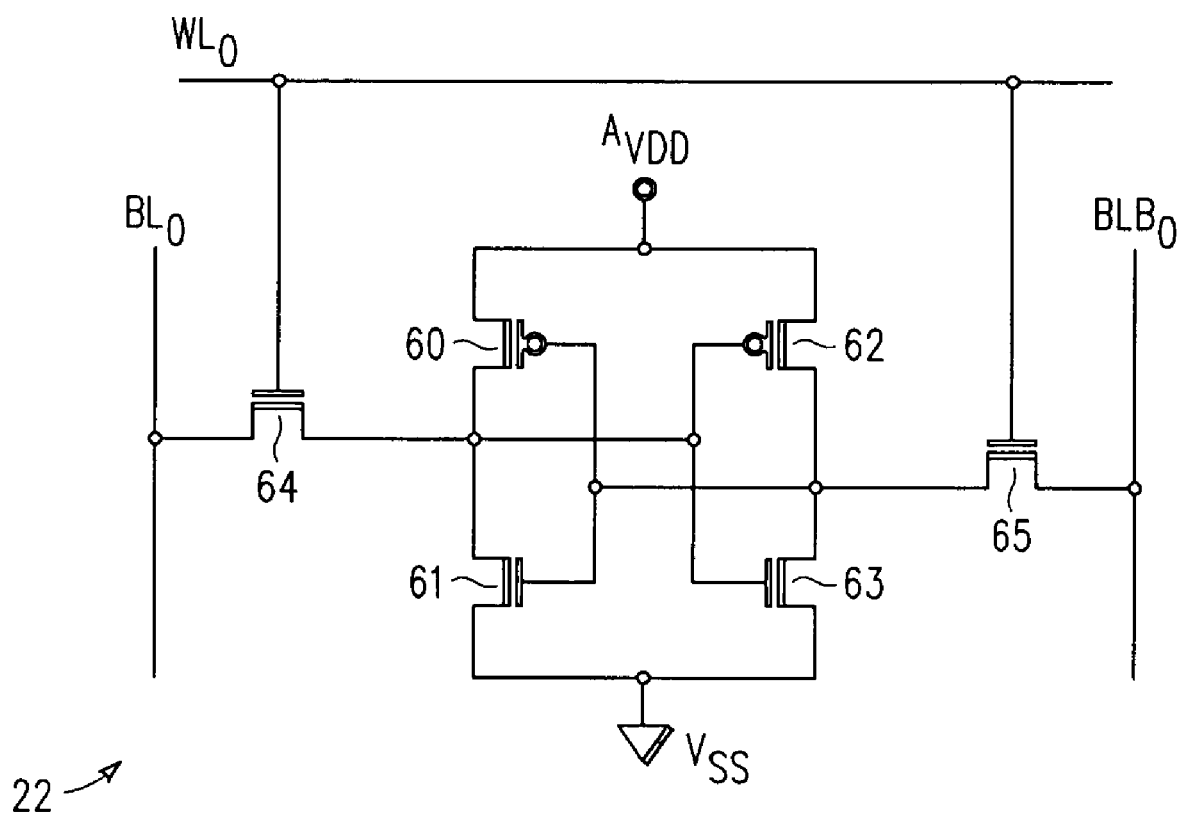
FIG. 3 illustrates, in schematic diagram form, a memory cell of the memory of FIG. 2.

FIG. 3 illustrates, in schematic diagram form, representative memory cell 22 of memory array 16 of FIG. 2. In FIG. 3, memory cell 22 is a conventional six transistor SRAM cell. Transistors 64 and 65 are access transistors having their control electrodes coupled to a word line, such as word line WL0, a current electrode coupled to one bit line of a bit line pair, and a current electrode coupled to the storage node of a cross-coupled pair of inverters. In FIG. 3, transistors 60 and 61 comprise one inverter and transistors 62 and 63 comprise the other inverter of the cross-coupled pair of inverters. Power supply voltage terminal AVDD is coupled to current electrodes of P-channel transistors 60 and 62. A power supply voltage terminal labeled "VSS" is coupled to current electrodes of N-channel transistors 61 and 63. In the illustrated embodiment, VSS is ground. In other embodiments, VSS can be another potential. Note that in other embodiments, the memory cell may comprise different or additional components.

There are various techniques for adjusting the read and write margins of SRAM cell 22. During the manufacturing process, a conductance ratio between the access transistors and the pull-up and pull-down transistors of the cross-coupled inverters determine a basic cell stability. The word line voltage, the bit line voltage, and power supply voltage can be adjusted to change the read and write margins. For example, the bit line voltage may be boosted from ground to below ground potential to improve the write margin. In another embodiment, the power supply voltage provided to VSS may be boosted above ground to improve the write margin. Therefore, one skilled in the art will know that the embodiment of FIG. 2 can be changed to improve the read and write margins of marginal cells besides changing the array power supply voltages AVDD0-AVDDN.

Figure 4:
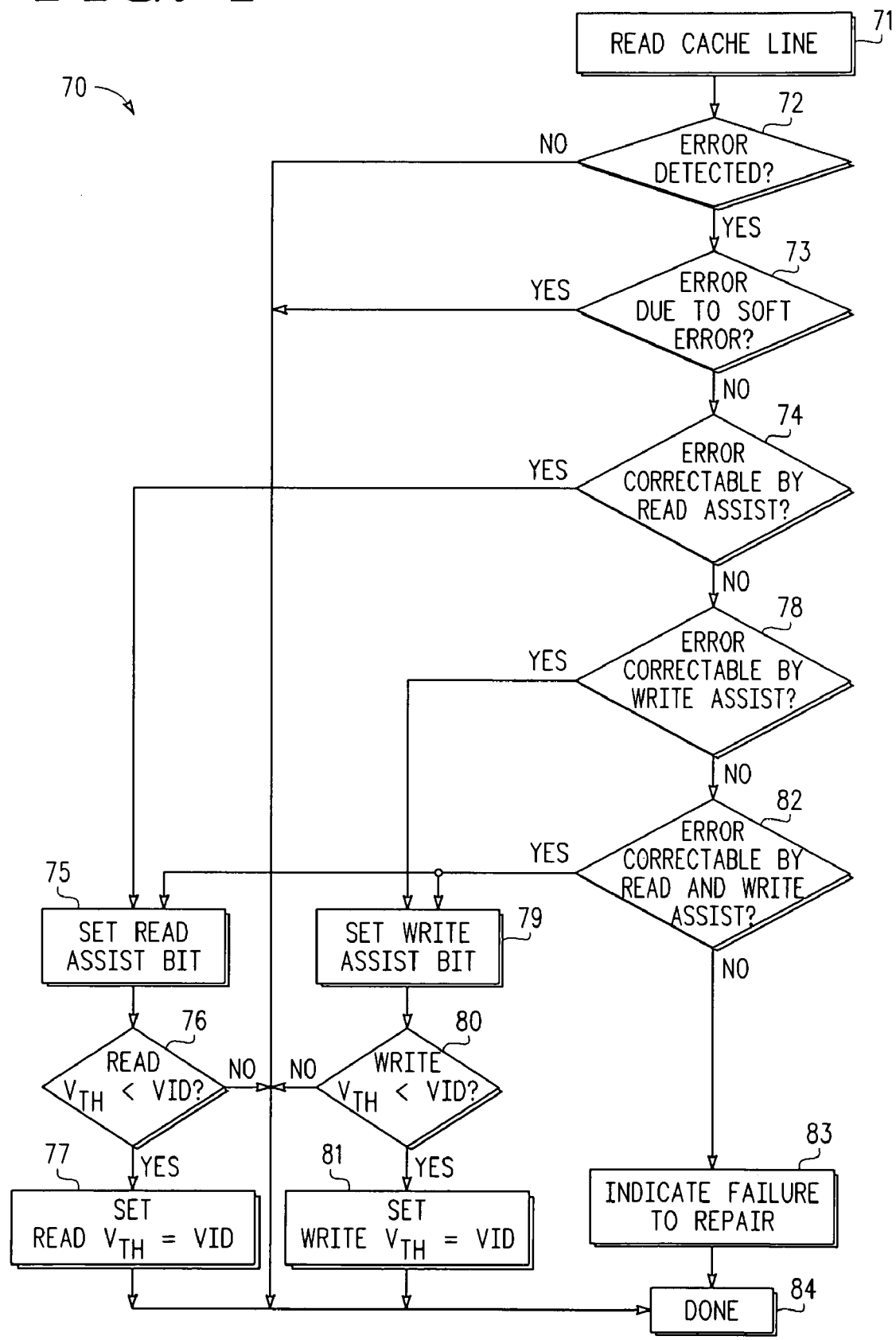
FIG. 4 illustrates a method for operating a memory in accordance with an embodiment.

FIG. 4 illustrates a method 70 for operating a memory in accordance with an embodiment. At step 71 of method 70, a cache line is read. At decision step 72, it is determined if an error exists for a memory cell of the cache line. In the illustrated embodiment, error correction code (ECC) is used to detect the errors. In other embodiments, another technique may be used to detect errors. If no error is detected, the NO path is taken to step 84 and the process is complete. If an error is detected, the YES path is taken to decision step 73. At decision step 73, it is determined if the error is due to soft error. If the error is due to soft error, the error will probably not reappear on a subsequent read. If the error is determined to be due to soft error, the YES path is taken to step 84. If the error is not due to soft error, the NO path is taken to decision step 74. At decision step 74, it is determined if the error is correctable by using read assist. If the error is correctable by read assist, the YES path is taken to step 75 and the read assist bit corresponding to the affected cache line entry in status array 32 is set. At decision step 76, it is determined if the read assist threshold voltage READ VTH is less than VID, if not, then the NO path is taken to step 84 and the process is complete. If the read assist threshold voltage READ VTH is less than VID, then the YES path is taken to step 77, where the read assist threshold voltage VTH is set equal to the current VID. After step 77, the method continues to step 84. Returning to decision step 74, if the error is not correctable by read assist, the NO path is taken to decision step 78 and it is determined if the error is correctable by write assist. If the error is correctable by write assist, the YES path is taken to step 79. At step 79 the write assist bit for the affected cache line entry in status array 32 is set. At step 80, it is determined if the write assist threshold WRITE VTH is less than VID. If the answer is no, the NO path is taken to step 84. If the write assist threshold WRITE VTH is less than VID, the YES path is taken to step 81 and the write assist threshold WRITE VTH is made equal to the current VID and the method continues to step 84. If, at decision step 78 the error is not correctable by write assist, the NO path is taken to decision step 82 and it is determined if the error is correctable by setting both the read and write assist bits. If the answer to decision step 82 is yes, the YES path is taken to steps 75 and 79, and the process of steps 75, 76, 77, 79, 80 and 81 are completed as described above. If the error is not correctable by setting both the read and write assist bits, the NO path is taken from decision step 82 to step 83. At step 83, it is indicated that the cache line read in error cannot be repaired using read and write assistance and the method proceeds to step 84.

Note that in another embodiment, steps 76, 77, 80, and 81 may be omitted. In this case, the method proceeds directly to step 84 from both of steps 75 and 79.

Figure 5:
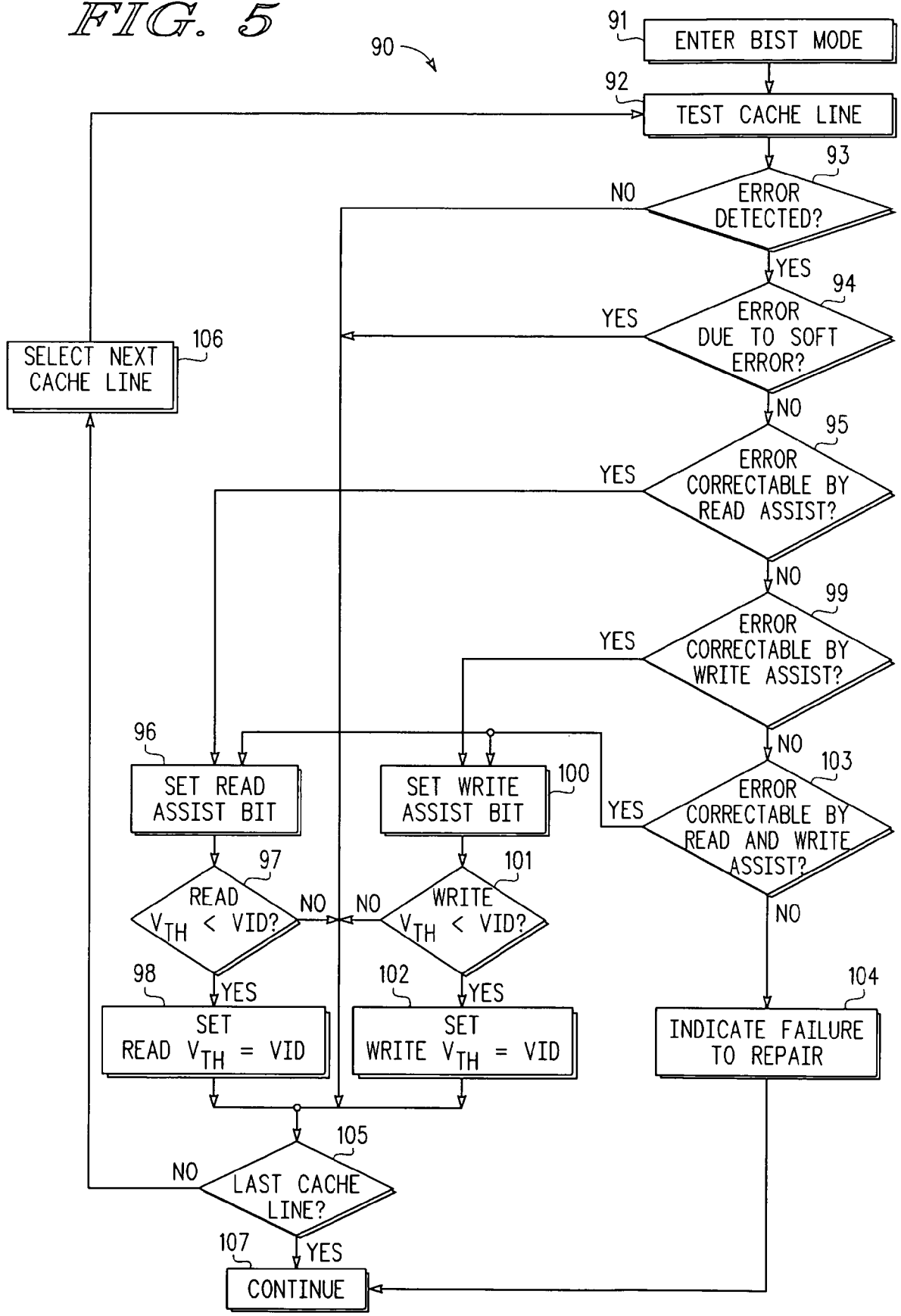
FIG. 5 illustrates a method for operating a memory in accordance with another embodiment.

FIG. 5 illustrates a method 90 for operating a memory in accordance with another embodiment. Method 90 begins at step 91 where BIST mode is entered. At step 92, a cache line is tested in BIST mode. At decision step 93, it is determined if one or more errors are detected in the cache line. If an error is not detected, the NO path is taken to decision step 105. If the cache line being tested is the last cache line to be tested, then the YES path is taken to step 107. If the last cache line has not been tested, then the NO path is taken from decision step 105 to step 106 and the next cache line to be tested is selected and the method continues at step 92. Returning to decision step 93, if an error is detected, the YES path is taken to decision step 94. At decision step 94, it is determined if the error is due to soft error. If the error is due to soft error, the YES path is taken to step 105. If the error is not due to soft error, the NO path is taken to step 95. At decision step 95, it is determined if the error is correctable by read assist. If the error is correctable by read assist, the YES path is taken to step 96. At step 96 the read assist bit for the selected cache line is set. At decision step 97, it is determined if the read assist threshold READ VTH is less than VID. If the answer is NO, the NO path is taken to step 1 05. If the read assist threshold READ VTH is less then VID, the YES path is taken to step 98. At step 98, the read assist threshold READ VTH register is made equal to VID and the method continues to step 105. Returning to step 95, if read assist will not correct the error, then the NO path is taken to step 99. At decision step 99, it is determined if the error is correctable by setting the write assist bit for the cache line. If the error is correctable, the YES path is taken to step 100. At step 100, the write assist bit for the cache line is set. At decision step 101, it is determined if the write assist threshold WRITE VTH is less than the VID. If the write assist threshold WRITE VTH is not less than the VID, the NO path is taken to step 105. If the write assist threshold WRITE VTH is less than the VID at step 101, the YES path is taken to step 102 and the write assist VTH register 42 is loaded with the current VID. The method continues from step 102 to step 105. If at decision step 99, the error is not correctable by write assist, the NO path is taken to step 103. At decision step 103, it is determined if both read and write assist will correct the error. If both read and write assist will correct the error, the YES path is taken to steps 96 and 100. Steps 96, 97, 98, 100, 101, and 102 are repeated. If at step 103 the error is not correctable by using both read and write assist, the NO path is taken to step 104. At step 104 is the failure to repair the cache line is indicated and the method continues to step 107.

Note that in another embodiment, steps 97, 98, 101, and 102 may be left out of the method. In this case, the method proceeds directly to step 105 from both of steps 96 and 100.

Figure 6:
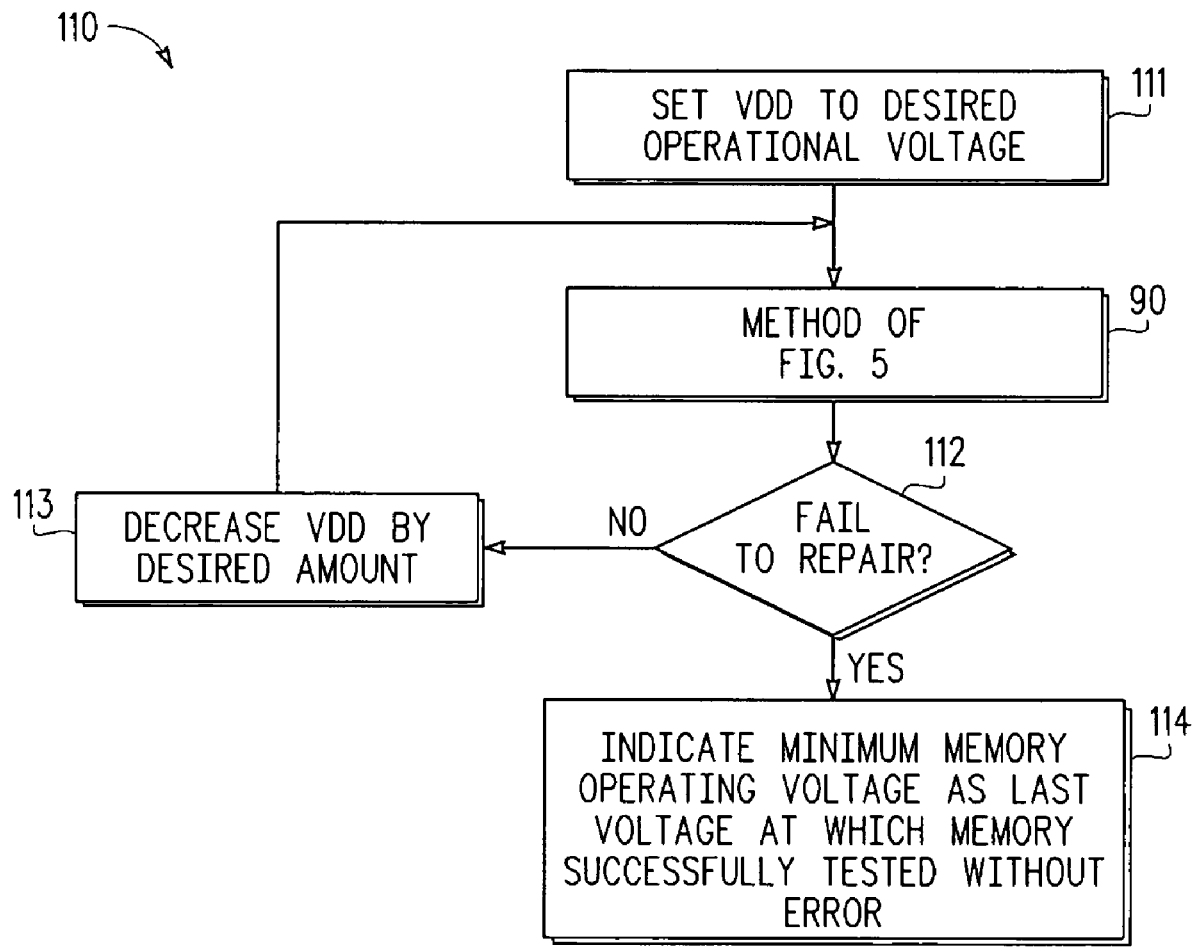
FIG. 6 illustrates a method for operating a memory in accordance with yet another embodiment.

FIG. 6 illustrates a method 110 for operating a memory in accordance with yet another embodiment. Method 110 begins at step 111. At step 111 power supply voltage VDD is set to a desired operational voltage, then the step of method 90 of FIG. 5 is followed. After method 90 is complete, it is determined at decision step 112 if the memory completed memory test without failure to repair. If the memory test was successful, the NO path is taken to step 113 and the power supply voltage VDD is decreased by a desired amount and method 90 and step 112 is repeated at the new VDD. Method 90 and step 112 may be repeated until the memory fails. When the memory fails, the YES path is taken from step 112 to step 114 where the minimum memory operating voltage is indicated as the last voltage at which the memory successfully tested without error. Method 110 may be used to determine the minimum operating voltage of memory array 16 of FIG. 2.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary integrated circuit, this exemplary integrated circuit is presented merely to provide a useful reference in discussing various aspects of the invention. Of course, the description of the integrated circuit has been simplified for purposes of discussion, and it is just one of many different types of appropriate integrated circuits that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the integrated circuits depicted herein are merely exemplary, and that in fact many other integrated circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of circuits or intermedial components. Likewise, any two components so associated can also be viewed as being "operably connected," or "operably coupled," to each other to achieve the desired functionality.

Also for example, in one embodiment, the illustrated elements of integrated circuit 10 are circuitry located on a single integrated circuit or within a same device. Alternatively, integrated circuit 10 may include any number of separate integrated circuits or separate devices interconnected with each other.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for operating a memory, comprising:
accessing a first portion of the memory, the first portion having a first access margin;
detecting an error in the first portion of the memory;
changing the first access margin to a second access margin, the second access margin being different than the first access margin;
determining that the error is corrected with the first portion having the second access margin; and
storing an access assist bit in a first storage element, the access assist bit corresponding to the first portion, wherein the assist bit, when set, indicates that subsequent accesses to the first portion are accomplished at the second access margin.

2. The method of claim 1, wherein accessing the first portion of the memory further comprises accessing the first portion of the memory for a read operation, and wherein the first and second access margins are first and second read margins.

3. The method of claim 1, wherein accessing the first portion of the memory further comprises accessing the first portion of the memory for a write operation, and wherein the first and second access margins are first and second write margins.

4. The method of claim 1, wherein changing the first access margin to the second access margin further comprises changing a magnitude of a power supply voltage provided to the first portion.

5. The method of claim 4, further comprising comparing the magnitude of the power supply voltage provided to the first portion to a first predetermined threshold, and in response to the magnitude having a predetermined relationship to the first predetermined threshold, changing the first predetermined threshold to a second predetermined threshold.

6. The method of claim 1, wherein the first portion of the memory comprises a first row of memory cells, and wherein the first row of memory cells is provided with a first power supply voltage during the step of accessing, the first power supply voltage being different than a second power supply voltage provided to a second row of memory cells during the step of accessing.

7. The method of claim 1, wherein the storing the access assist bit in a first storage element further comprises storing the access assist bit in a location of a status array associated with the memory.

8. The method of claim 1, wherein detecting the error in the first portion further comprises detecting the error using a built-in self-test (BIST) circuit.

9. The method of claim 1, wherein the memory is a cache, the cache comprising a plurality of static random access memory (SRAM) cells.

10. A method for accessing a memory comprising:
receiving an access request to a first portion of the memory with a power supply voltage applied to the first portion of the memory at a first value;
detecting an error in the first portion of the memory;
changing the power supply voltage to a second value;
determining that the error is corrected when the power supply voltage is at the second value; and
storing an assist bit in a first storage element, the assist bit corresponding to the first portion, wherein the assist bit, when set, indicates that subsequent accesses to the first portion are accomplished with the power supply voltage at the second value.

11. The method of claim 10, wherein the memory access request is a read request, and wherein changing the power supply voltage to the second value further comprises increasing the power supply voltage to the second value in response to reading the assist bit.

12. The method of claim 10, wherein the memory access request is a write request, and wherein changing the power supply voltage to the second value further comprises decreasing the power supply voltage to the second value in response to reading the assist bit.

13. The method of claim 10, wherein the memory is a cache memory and the first portion comprises a cache line.

14. The method of claim 10, wherein storing the assist bit in the first storage element further comprises:
storing a write assist bit for setting the power supply voltage provided to the first portion to a third value during a write operation of the first portion; and
storing a read assist bit for setting the power supply voltage provided to the first portion to a fourth value during a read operation of the first portion.

15. The method of claim 14, wherein storing the write assist bit further comprises storing the write assist bit in a first location of a status array associated with the first portion and storing the read assist bit further comprises storing the read assist bit in a second location of the status array associated with the first portion.

16. An integrated circuit, comprising:
a processor;
a first memory coupled to the processor, the first memory having an array comprising a plurality of portions of memory cells, each memory cell of the plurality of portions of memory cells having a power supply voltage terminal;
a test circuit coupled to the first memory, the test circuit for testing the first memory and for determining if a failed portion of the first memory is correctable by changing a power supply voltage provided to the failed portion;
an array power supply voltage multiplexer having a first input for receiving a first power supply voltage, a second input for receiving a second power supply voltage, and an output coupled to the power supply voltage terminals of a first portion of the plurality of portions of memory cells; and
a second memory coupled to the array power supply voltage multiplexer, the second memory for storing an access assist bit, the access assist bit associated with the first portion of the plurality of portions of memory cells, the access assist bit being set in response to the test circuit, the access assist bit for determining which one of the first and second power supply voltages is coupled to the power supply voltage terminals of the first portion of the plurality of memory cells during an access of the first portion.

17. The integrated circuit of claim 16, wherein the first portion is characterized as being a column of memory cells.

18. The integrated circuit of claim 16, wherein the array power supply voltage multiplexer further comprises a third input for receiving a third power supply voltage, wherein the second memory for storing a second access assist bit, the second access assist bit associated with the first portion, the access assist bit and the second access assist bit for determining which one of the first, second, and third power supply voltages is coupled to the power supply voltage terminals of the first portion during an access of the first portion.

19. The integrated circuit of claim 16, further comprising:
a threshold voltage register for storing a first plurality of bits corresponding to an access assist threshold voltage; and
a comparator having a first input coupled to receive the first plurality of bits, and a second input coupled to receive a second plurality of bits corresponding to the first power supply voltage, and an output coupled to the array power supply voltage multiplexer, wherein one of the first power supply voltage and the second power supply voltage is provided to the first portion in response to a predetermined comparison result.

20. The integrated circuit of claim 16, wherein the second memory is characterized as being a status array having a plurality of entries, each of the plurality of entries corresponding to a portion of the plurality of portions of the first memory.

* * * * *